United States Patent

Fujikawa et al.

[11] Patent Number: 5,704,214
[45] Date of Patent: Jan. 6, 1998

[54] APPARATUS FOR REMOVING TRAMP MATERIALS AND METHOD THEREFOR

[75] Inventors: Yuichiro Fujikawa; Seishi Murakami; Tatsuo Hatano, all of Yamanashi-ken, Japan

[73] Assignee: Tokyo Electron Limited, Tokyo, Japan

[21] Appl. No.: 634,164

[22] Filed: Apr. 18, 1996

[30] Foreign Application Priority Data

Apr. 20, 1995 [JP] Japan .................................. 7-119404

[51] Int. Cl.$^6$ .................................................. B01D 8/00
[52] U.S. Cl. .................................................. 62/55.5; 417/901
[58] Field of Search .................................... 62/55.5; 417/901

[56] References Cited

U.S. PATENT DOCUMENTS

| | | | |
|---|---|---|---|
| 4,479,361 | 10/1984 | Osher | 417/901 X |
| 4,551,197 | 11/1985 | Guilmette et al. | 62/55.5 X |
| 5,303,558 | 4/1994 | Caton et al. | 62/55.5 |

FOREIGN PATENT DOCUMENTS

| | | |
|---|---|---|
| 59-217617 | 12/1984 | Japan . |
| 2-61067 | 3/1990 | Japan . |
| 3-28377 | 2/1991 | Japan . |

*Primary Examiner*—Christopher Kilner
*Attorney, Agent, or Firm*—Beveridge, DeGrandi, Weilacher & Young, L.L.P.

[57] ABSTRACT

A trap body is removably attached in the housing inserted in that portion of the exhaust passage which is situated on the upstream side of a vacuum pump, and has cooling fins for cooling the tramp materials in the exhaust gas brought into contact with the cooling means, thereby liquefying the tramp materials. Therefore, the tramp materials, such as unaffected process gases, products of reaction, etc., contained in the exhaust gas flowing through the exhaust passage, are cooled and liquefied when they are touched by the trap body cooled by the cooling unit, and adhere to the surface of the trap body. Thus, the tramp materials in the exhaust gas can be removed lest they damage the vacuum pump on the downstream side or close up the exhaust passage.

5 Claims, 4 Drawing Sheets

APPARATUS FOR REMOVING TRAMP MATERIALS AND METHOD THEREFOR

BACKGROUND OF THE INVENTION

1. Field of the Invention

The present invention relates to a removing apparatus for removing tramp materials contained in exhaust gas from a process apparatus, such as a metal CVD apparatus, or the like, and a method therefor.

2. Information of the Related Art

Generally, in manufacturing a semiconductor integrated circuit, a semiconductor wafer is repeatedly subjected to various processes, such as film deposition, etching, etc. Films to be deposited on the wafer include oxide films for insulation and metallic films for wiring, and organic metallic compounds are mainly used as process gases for the deposition of metallic films. However, on supplying the organic metallic compounds, the control of their temperature is relatively difficult. Also, some of these compounds react with water or alcohol, thereby producing reactive gases (harmful gases).

Accordingly, affected or unaffected gases flow in an exhaust system, not to mention the process gases flowing in a supply system, so that measures must be taken to meet this situation.

The following is a description of a conventional single-wafer-type metal CVD apparatus which is used to deposit a TiN (titanium nitride) film as a metallic film.

In depositing the titanium nitride film, tetradiethylamino titanium (TDEAT), an organic material, and ammonia gas ($NH_3$), a reducing agent, are used as process gases, and an inert gas, such as helium, is used as a carrier gas. The semiconductor wafer is put on a stage in a process container, and is heated to and kept at a process temperature by means of high-intensity heater lamps, such as halogen lamps, in advance. In this state, the process container is supplied with TDEAT, which is vaporized by means of the carrier gas, and also with ammonia gas, and these supplied gases are caused to react, thereby depositing the TiN film.

Naturally, the process container is always evacuated so that a predetermined process pressure can be maintained during the film deposition.

All the process gases fed into the process container do not react with one another, and some gases remain unaffected. Therefore, exhaust gas flowing in a vacuum exhaust system, which extends from a process apparatus, inevitably contains unaffected process gases, and naturally, is loaded with products of reaction.

In this case, the unaffected process gases and products of reaction flow in a gaseous phase in the vacuum exhaust system. There is no problem if the gases and products can be removed by means of a removing apparatus. However, many of the organic materials and products of reaction of this kind easily re-liquefy at normal temperature.

For example, TDEAT forms a film by reacting at about 100° C. or more when it is mixed with ammonia. At about 40° C. or less, that is, at normal temperature, on the other hand, TDEAT liquefies into a highly viscous liquid. If the vacuum exhaust system is not processed at all, therefore, the unaffected process gases or the products of reaction, which liquefy at normal temperature, re-liquefy and deposit in a vacuum pump, which is inserted in an exhaust passage of the vacuum exhaust system at normal temperature, possibly closing up the passage or damaging the pump.

In order to prevent this, a heater may be provided covering the entire vacuum exhaust system so that the whole system can be heated to a temperature not lower than the liquefying temperatures of the process gases and products of reaction. In this case, however, the heater must be provided for the whole system including the vacuum pump, so that it should be impractically large in general size.

SUMMARY OF THE INVENTION

The object of the present invention is to provide a removing apparatus capable of efficiently removing tramp materials, such as unaffected process gases, products of reaction, etc., contained in exhaust gas, a vacuum exhaust system using the same, and a method therefor.

According to one aspect of the present invention, there is provided a tramp material removing apparatus, which is mounted in a vacuum exhaust system for sucking and discharging an exhaust gas by a vacuum pump from a process apparatus, for removing a tramp material contained in the exhaust gas, said removing apparatus comprising:

a housing inserted in that portion of the exhaust passage which is situated on the upstream side of the vacuum pump; and a trap body removably attached in the housing, and having cooling means for cooling the tramp material in the exhaust gas brought into contact with the cooling means, thereby liquefying the tramp material.

According to the one aspect of the present invention arranged in this manner, the tramp materials, such as unaffected process gases, products of reaction, etc., contained in the exhaust gas flowing through the exhaust passage, are cooled and liquefied when they are touched by the trap body cooled by the cooling means, and adhere to the surface of the trap body. Thus, the tramp materials in the exhaust gas can be removed lest they damage the vacuum pump on the downstream side or close up the exhaust passage.

In this case, the trap body may be provided with trap fins whose angle is adjustable so that an optimum exhaust conductance can be set by suitably adjusting the angle of the trap fins.

The housing, which contains the trap body therein, may be provided with heating means for preventing adhesion of the tramp materials. By using this heating means to heat the housing to a predetermined or higher temperature in advance, the tramp materials can be caused to adhere to the trap body only and prevented from liquefying and adhering to the housing.

Further, passage heating means may be provided in that portion of the exhaust passage which is situated between the process apparatus and the removing apparatus. With use of this heating means, the tramp materials can be prevented from liquefying and depositing in the middle of the passage by heating the passage to a predetermined or higher temperature in advance.

According to another aspect of the present invention, there is provided a tramp material removing method for removing a tramp material from a vacuum exhaust system for sucking and discharging an exhaust gas by a vacuum pump from a process apparatus, said vacuum exhaust system comprising a removing apparatus including a housing inserted in that portion of the exhaust passage which is situated on the upstream side of the vacuum pump, and a trap body removably attached in the housing, and having cooling means for cooling the tramp material in the exhaust gas brought into contact with the cooling means, thereby liquefying the tramp material, said removing method comprising the steps of:

isolating said vacuum exhaust system and removing apparatus, after the tramp material in the exhaust gas is cooled and liquefied by the cooling means in the trap body;

introducing water or alcohol into the housing of the isolated removing apparatus so that the water or alcohol reacts with the tramp material to produce reactive gases and solidified deposits; and removing reactive gases and solidified deposits from the housing of the removing apparatus.

In such a manner, in a maintenance operation for the vacuum exhaust system, water or alcohol is supplied to and caused to react with the tramp materials, which adhere to the trap body, so that the tramp materials release reactive gases (harmful gases), and the reactive gases thus produced are discharged by evacuation. Thereafter, the trap body is taken out from the housing, and the stabilized tramp materials on the trap body are removed.

In causing the deposits to react with water or alcohol, the removing apparatus itself should preferably be isolated from the outside lest the produced reactive gases leak out.

Furthermore, the step of reaction between the deposits and water or alcohol and the step of reactive gas discharge should be executed repeatedly so that the reaction of the deposits is completed.

DETAILED DESCRIPTION OF THE PREFERRED EMBODIMENTS

Figure 1:
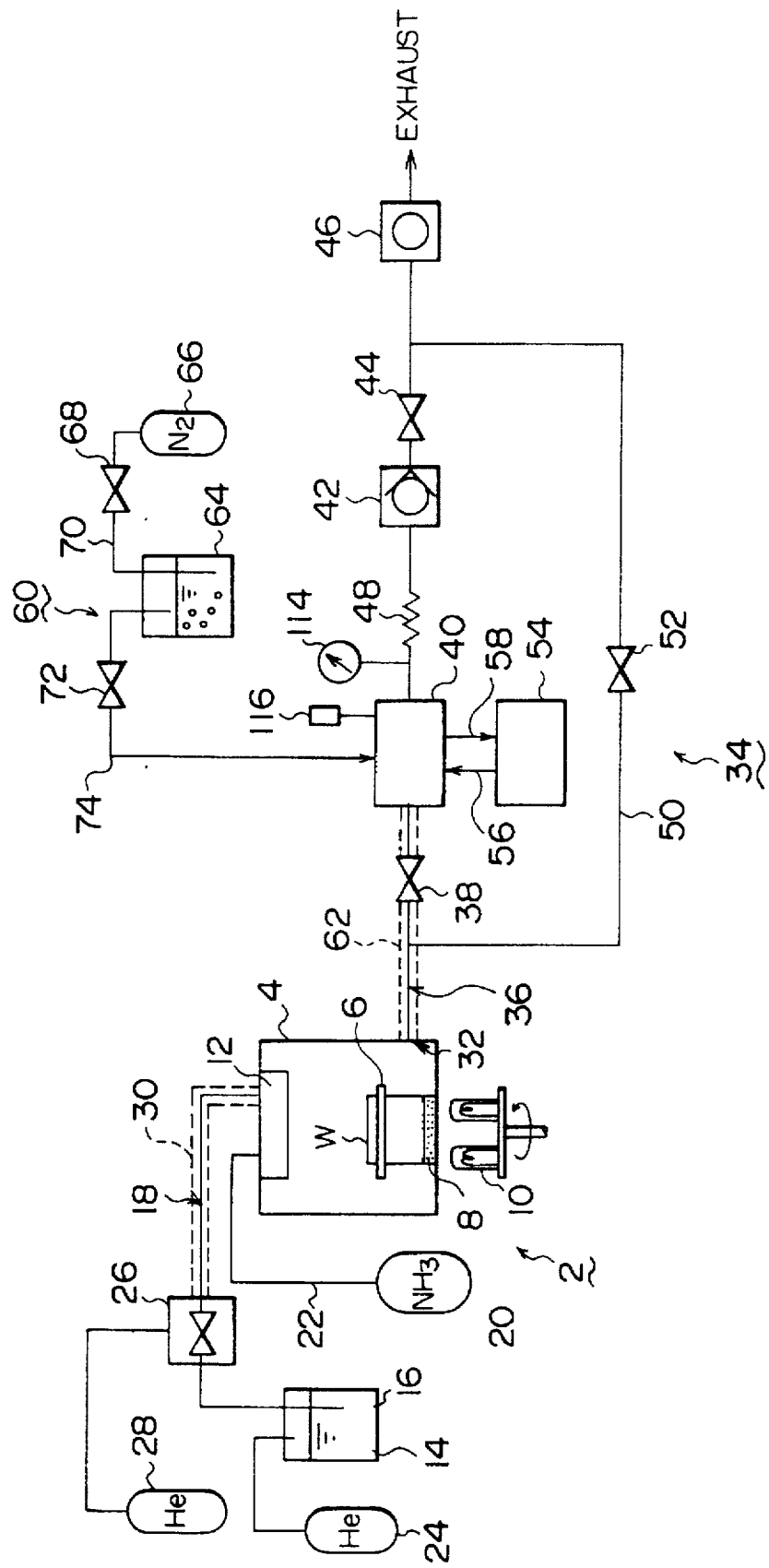
FIG. 1 is a schematic view showing an outline of a process apparatus provided with a vacuum exhaust system and a removing apparatus according to an embodiment of the present invention.

A tramp material removing apparatus according to an embodiment of the present invention, a vacuum exhaust system provided with the removing apparatus, and a removing method thereof will become understood from the following detailed description referring to the accompanying drawings.

The process apparatus is a single-wafer-type metal CVD apparatus, which serves to deposit a metallic TiN (titanium nitride) film by using tetradiethylamino titanium (TDEAT), a material gas, and ammonia gas, a reducing agent, as process gases.

The metal CVD apparatus 2 as the process apparatus comprises a cylindrical process container 4 of aluminum or the like. A stage 6 of graphite or the like is set in the process container 4, and a semiconductor wafer W as an object to be processed can be held on the stage 6.

A transparent window 8 of quartz glass is attached airtight to the base portion of the process container 4, and high-intensity heater lamps 10, such as halogen lamps, are arranged for rotation under the window 8, whereby the wafer W can be heated.

A shower head 12 is attached to the top portion of the process container 4. It is connected with a material gas passage 18, which is coupled to a material gas source 16 stored with liquid TDEAT 14 to provide the material gas, and a reducing gas passage 22, which is coupled to a reducing gas source 20 stored with ammonia as a reducing gas.

An end portion of the material gas passage 18 is immersed in the liquid TDEAT 14. By supplying helium from a helium source 24 to the inside space of a container of the liquid TDEAT 14, the liquid 14 can be fed under pressure at a controlled flow rate. A carburetor 26 is inserted in the middle of the material gas passage 18. The carburetor 26 is used to vaporize or atomize the fed liquid TDEAT 14 by means of a carrier gas, e.g., helium gas, from a carrier source 28. The material gas passage 18 between the carburetor 26 and the shower head 12 is provided with a heater 30 for preventing re-liquefaction.

A vacuum exhaust system 34 according to the present invention is connected to an exhaust port 32 of the process container 4. More specifically, the exhaust system 34 includes one or more exhaust passages 36 of stainless steel having an inside diameter of about 60 mm, for example. A first on-off valve 38, a tramp material removing apparatus 40 according to the invention, a pump 42 for precision evacuation, a drag pump or the like, a second on-off valve 44, and a pump 46 for rough evacuation, a dry pump or the like are arranged successively from the upstream side of the passages 36 to the downstream side. Also, a passage between the removing apparatus 40 and the pump 42 for precision evacuation is fitted with a bellows 48, which allows the apparatus 40 to move in the lengthwise direction of the passage when the apparatus 40 is attached or detached.

A passage 50 for rough evacuation is arranged as a bypass which connects the passage on the upstream side of the first on-off valve 38 and the passage on the downstream side of the second on-off valve 44, and an on-off valve 52 for rough evacuation is inserted in the middle of the passage 50.

Passage heating means 62, a tape heater or the like, is wound around the entire exhaust passage 36 between the exhaust port 32 of the process container 4 and the removing apparatus 40. The heating means 62 heats the passage to a temperature not lower than the liquefying temperatures of tramp materials in exhaust gas, thereby preventing the tramp materials from liquefying in the middle of the passage.

The removing apparatus 40 serves to cool the tramp materials, such as unaffected process gases, products of reaction, etc., contained in the exhaust gas which flows therein, thereby causing them to be deposited. To attain this, the apparatus 40 is furnished with a coolant source 54 which is stored with a coolant such as ethylene glycol. Thus, the coolant can be fed into or discharged from the removing apparatus 40 through a coolant supply pipe 56 or a coolant discharge pipe 58.

Further, the removing apparatus 40 is connected with water (or alcohol) supply means 60, which causes the tramp materials, deposited and trapped therein, to react with water or alcohol, thereby rendering them harmless. The supply means 60 includes a bubbling container 64 stored with water or alcohol. Nitrogen gas from a nitrogen gas source 66 is introduced into the container 64 through a nitrogen passage 70, which has a flow control valve 68 therein, and is bubbled in the container 64, whereby wet nitrogen gas containing water or alcohol is produced. The wet nitrogen gas is fed as required into the removing apparatus 40 through a water (or alcohol) supply pipe 74, which has a flow control valve 72 in the middle.

The following is a description of the removing apparatus 40.

Figure 2:
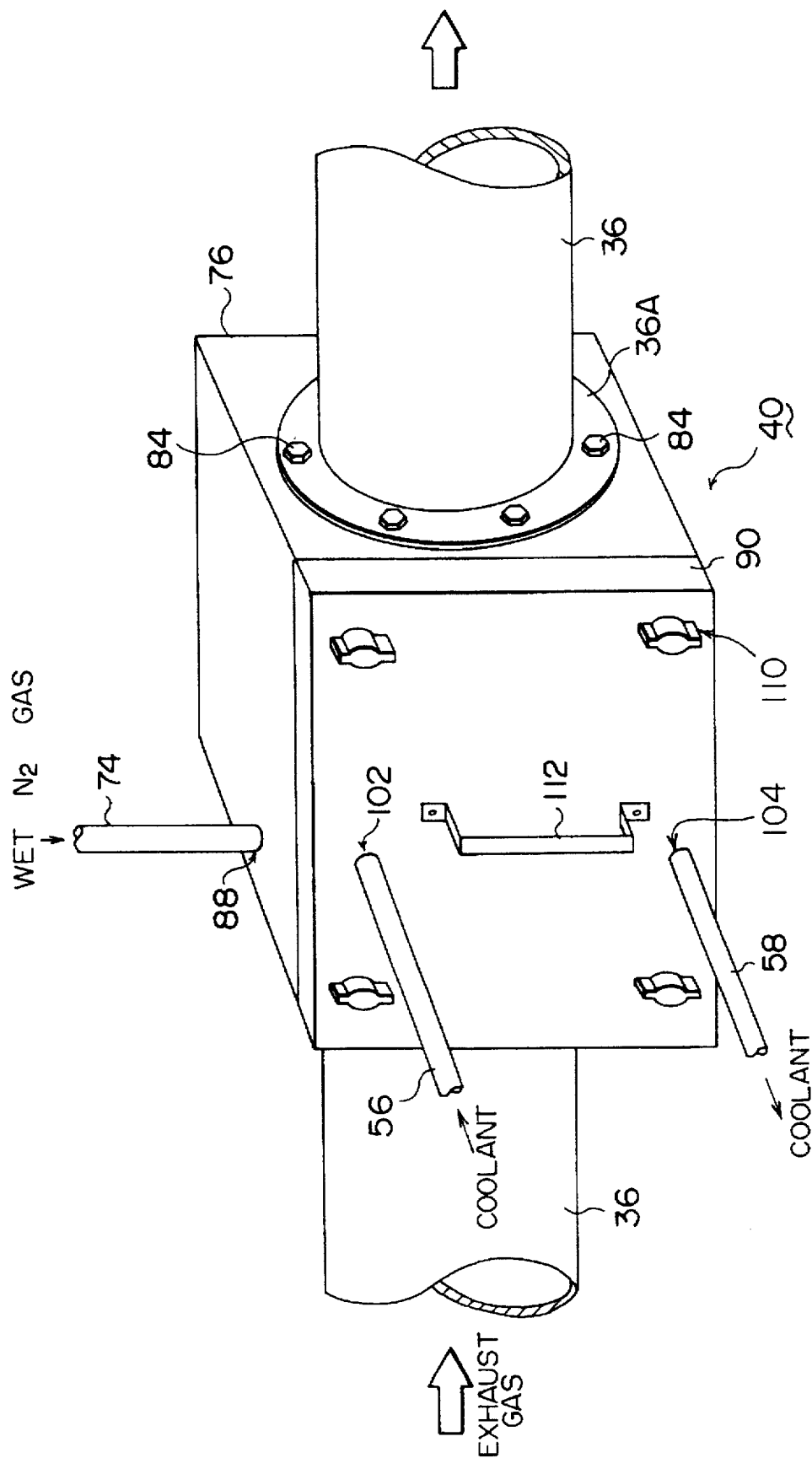
FIG. 2 is a perspective view of the removing apparatus according to the embodiment of the invention.
Figure 3:
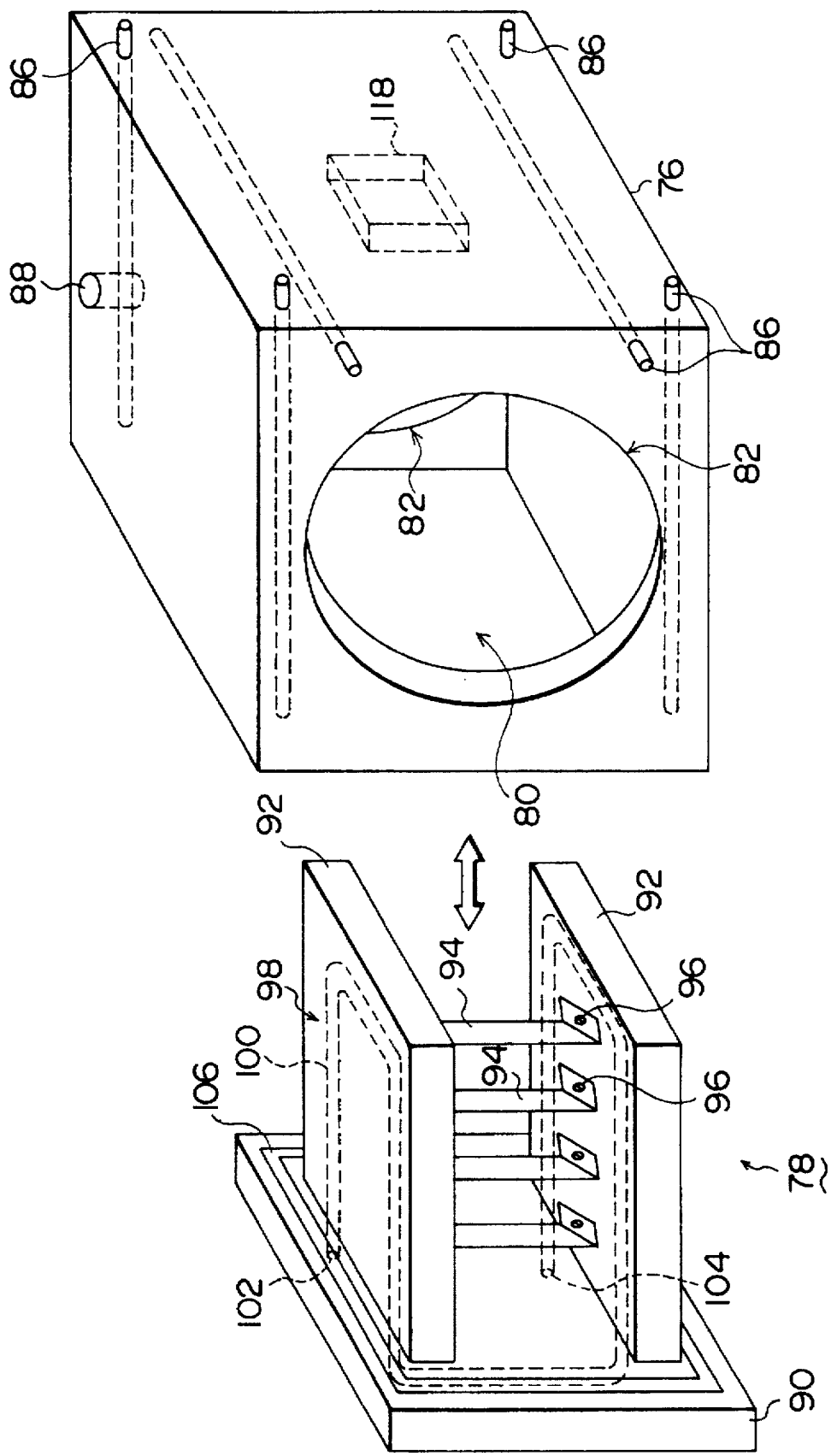
FIG. 3 is an exploded perspective view of the removing apparatus shown in FIG. 2.

As is also shown in FIGS. 2 and 3, the removing apparatus 40 is composed mainly of a housing 76 of, for example, aluminum in the exhaust passage 36 and a trap body 78, which is removably attached to the housing 76. The housing 76 is substantially cubic in shape, and has a trap mounting aperture 80 on one side, in which the trap body 78 can be set. Two opposite side walls of the housing 76 on either side of the aperture 80 are formed with a passage counting aperture 82 each. The housing 76 and the passage 36 are coupled to each other by fixing flanges 36A of the passage 36 individually to the respective peripheral edges of the two passage mounting apertures 82 by means of bolts 84. A cartridge heater in the form of, for example, a rod is embedded in position in each of five side walls of the housing 76, thus forming heating means 86 for adhesion prevention. The tramp materials are prevented from adhering to the walls of the housing 76 by heating the walls to a temperature not lower than the liquefying temperatures of the tramp materials, e.g., about 40° C. Moreover, one of the side walls of the housing 76 is penetrated by a water (or alcohol) supply port 88, and the water (or alcohol) supply pipe 74 is coupled to the port 88 so that the wet nitrogen gas can be fed into the housing 76 through the port 88.

On the other hand, the trap body 78 is deposited entirely of aluminum, for example, and mainly comprises a cover member 90, two fin mounting plates 92, and a plurality of trap fins 94. The cover member 90 is attached to the trap mounting aperture 80 of the housing 76 so as to seal it hermetically. The mounting plates 92 are formed extending parallel to each other in the horizontal direction, and the trap fins 94 are stretched between the plates 92.

The fin mounting plates 92 are formed of a material, such as aluminum, which has good thermal conductivity and is easily workable, and are spaced at a distance substantially equal to or greater than the diameter of the exhaust passage 36. When the mounting plates 92 are set in position, they sandwich an exhaust gas flow from above and below, for example.

The trap fins 94 stretched between the two fin mounting plates 92 are formed of aluminum plates 1 mm thick and 10 mm wide, for example, and are arranged at predetermined pitches. The upper and lower end portions of each fin 94 are bent and fixed to the mounting plates 92 by means of screws 96. Although only four fins are shown in FIG. 3, more than ten fins are used actually, depending on the diameter of the exhaust passage.

Figure 4:
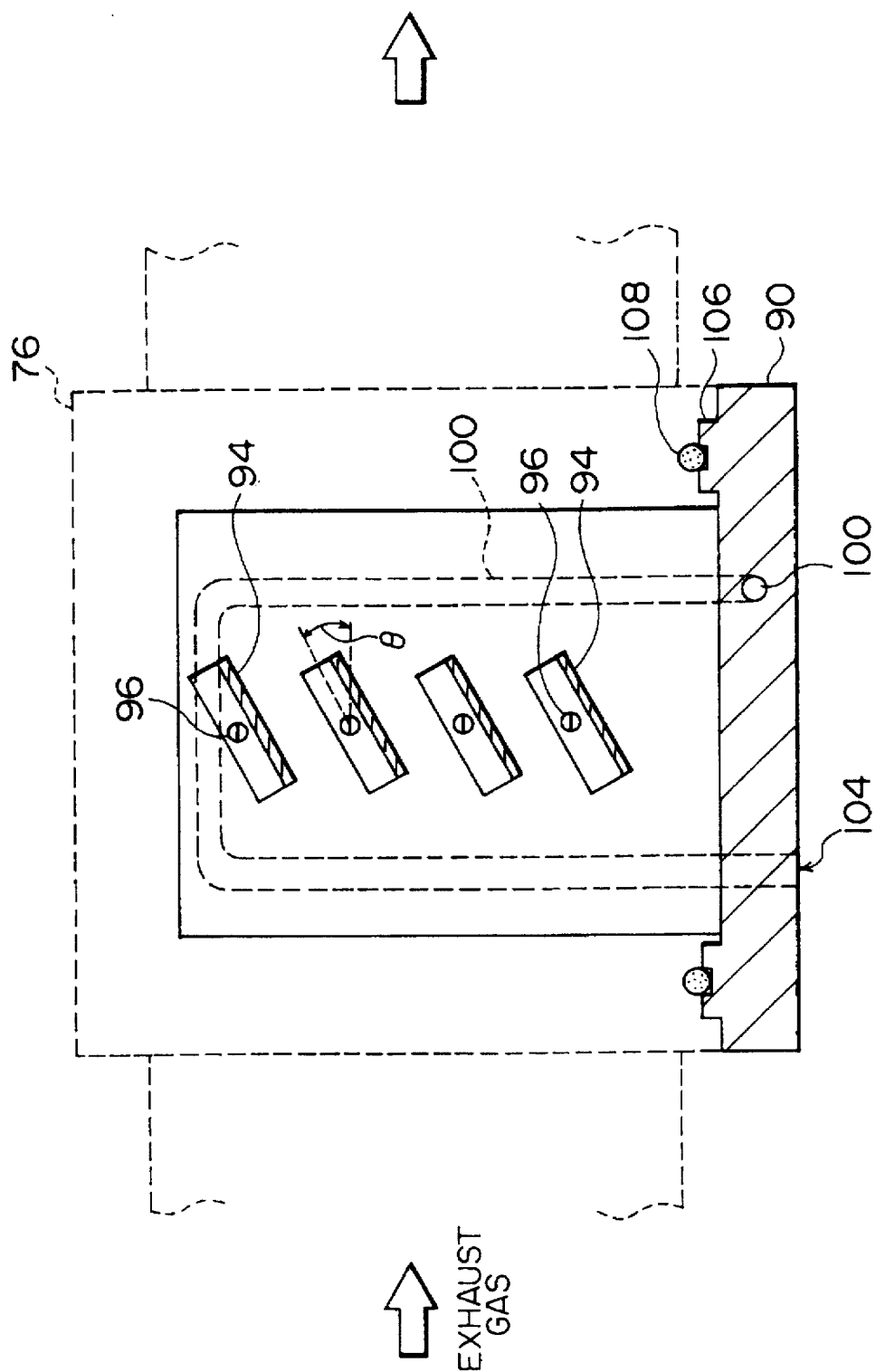
FIG. 4 is a cross-sectional view showing a trap body of the removing apparatus.

The fins 94 are arranged extending in a direction perpendicular to the flowing direction of the exhaust gas, that is, across the exhaust passage. If the screws 96 are loosened, the fins 94 can be rotated around them so that their angle θ (see FIG. 4) to the exhaust gas flow can be changed.

The trap body 78 is provided with cooling means 98 for cooling the same. The cooling means 98 is formed as a coolant passage 100 which internally connects the cover member 90 and the fin mounting plates 92. As shown in FIG. 3, the passage 100 extends from a coolant inlet 102 in the cover member 90, circulates through the upper fin mounting plate 92, extends downward in the cover member 90, circulates through the lower fin mounting plate 92, and then reaches a coolant outlet 104 in the cover member 90.

The coolant passage 100 can be easily formed by drilling. The coolant supply pipe 56 and the coolant discharge pipe 58 are removably attached to the coolant inlet and outlet 102 and 104, respectively. By circulating the coolant, cooled to about −20° C., through the fin mounting plates 92, the trap fins 94 are cooled to substantially the same temperature so that the tramp materials in the exhaust gas can be liquefied and deposited on the fin surface.

A contact ridge 106 is formed covering the whole area of a contact portion of the cover member 90, which is adapted to come into contact with the housing 76. Thus, the area of contact between the cover member 90 and the housing 76, joined together, is minimized to increase thermal resistance so that heat transfer between the two members is minimized. The contact ridge 106 is provided with a seal member 108, such as an O-ring, whereby airtightness of the assembly can be secured.

The cover member 90 can be easily attached to the housing 76 by means of, for example, four thumbscrews 110 which can be turned manually, as shown in FIG. 2. Also, the cover member 90 is fitted with a handle 112 for ease of removal.

The following is a description of the operation of the apparatus of the embodiment constructed in the aforementioned manner.

First, the semiconductor wafer W is fixed on the stage 6 in the process container 4, and the vacuum exhaust system 34 is actuated to evacuate the process container 4 to a predetermined pressure. The heater lamps 10 are actuated to keep the wafer W a process temperature, and misty tetradiethylamino titanium (TDEAT), as the material gas, and ammonia gas, as the reducing agent, are fed from the material gas source 16 and the reducing gas source, respectively, into the process container 4. These gases are caused to react with each other, thereby depositing a TiN film on the surface of the wafer W. During the period of this film deposition, the vacuum exhaust system 34 is actuated to keep the process pressure at about 200 mtorr, for example.

The material gas, TDEAT, is not conducive to all reactions in the process container 4. Some of the material gas flows unaffected into the exhaust system, and some products of reaction also flow into the exhaust system without adhering to the wafer surface.

Since the TDEAT liquefies at about 40° C. or less, as mentioned before, the unaffected material gas is removed from the exhaust gas by using the removing apparatus 40 of the present invention, in order to prevent it from re-liquefying in a vacuum pump or the like in the exhaust system and damaging it. At the same time, the products of reaction which easily liquefy are removed.

The following is a description of the evacuating operation of the vacuum exhaust system 34.

In evacuating the process container 4 at atmospheric pressure or thereabout, the pump 46 for rough evacuation is actuated with the first and second on-off valves 38 and 44 in the exhaust passage 36 closed and with the on-off valve 52 for rough evacuation open. Thus, the ambience in the container 4 is discharged through the passage 50 for rough evacuation.

When the pressure in the process container 4 is lowered to a predetermined level, e.g., about 200 to 900 mtorr, by this evacuation, the on-off valve 52 for rough evacuation is closed, the first and second on-off valves 38 and 44 are opened, and the pump 42 for precision evacuation is actuated further to evacuate the container 4. In this state, the TiN film is deposited.

During the deposition of the TiN film, the coolant, cooled to about −20° C., for example, is supplied the trap body 78 from the coolant source 54, which is attached to the removing apparatus 40. The coolant flows through the coolant passage 100 in the fin mounting plates 92, thereby cooling the trap fins 94 to substantially the same temperature. Accordingly, the unaffected process gases and products of reaction, contained in the exhaust gas flowing in the exhaust passage 36, are cooled and re-liquefied by touching the trap fins 94, and are removed from the exhaust gas by adhering to fin surface.

Thus, the exhaust gas cleared of the tramp materials flows through the two pumps 42 and 46, which are situated on the downstream side of the removing apparatus 40, so that damages attributable to adhesion of liquid substances can be avoided. Also, the liquid substances can be prevented from depositing in that portion of the exhaust passage 36 which is situated on the downstream side of the apparatus 40, thereby narrowing or closing up the passage.

The efficiency of removal of the tramp materials from the exhaust gas is adjusted by changing the efficiency of contact between the fins 94 and the exhaust gas. The contact efficiency can be changed by varying the temperature of the coolant to control the temperature of the fins 94 or by loosening the screws 96 for fixing the fins 94 and suitably changing the tilt angle θ of the fins 94 to the flowing direction of the exhaust gas. If the angle θ is set at too great a value, the gas passage is so narrow that the exhaust conductance is too low for a satisfactory exhaust speed. Accordingly, the angle θ is adjusted to an appropriate value in consideration of the exhaust speed and removal efficiency.

Deposits on the trap body 78 can be easily removed after disengaging the body 78 from the housing 76. Since the housing 76 is attached firmly to the exhaust passage 36, however, the deposits cannot be removed with ease if they adhere to the housing 76.

Accordingly, a plurality of heating means 86 for adhesion prevention are embedded in the housing 76, whereby the entire housing 76 is heated to a temperature, e.g., about 50° C., which is higher than the liquefying temperatures. Thus, the unaffected process gases can be prevented from re-liquefying and adhering to the inner wall surface of the housing 76.

The passage heating means 62 is provided covering the entire exhaust passage 36 between the exhaust port 32 of the process container 4 and the removing apparatus 40, and serves to heat the passage itself to a temperature, e.g., about 50° C., which is higher than the liquefying temperatures of the unaffected process gases or products of reaction. Thus, the unaffected process gases or products of reaction can be prevented from liquefying and narrowing the flow area of the passage.

While the trap body 78 is cooled in this manner, the housing 76 itself is heated. Therefore, a substantial heat loss is caused if heat is transferred between these components without resistance. However, the heat loss can be minimized, since the cover member 90 of the trap body 78 is formed with the contact ridge 106 so that the contact area is minimized to increase the thermal resistance.

If the film depositing process is executed repeatedly, large quantities of unaffected process gases and products of reaction liquefy and adhere to the trap body 78, so that a maintenance operation is needed to remove them.

There is no problem if the deposits produce no gases. If any gases are generated from the deposits, however, the trap body 78 cannot be removed suddenly from the housing 76.

For example, the TDEAT used in this case reacts with water or atmospheric water, thereby depositing stable titanium oxide as follows.

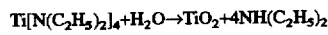

Also in the case where tetradimethylamino titanium (TDMAT) is used as the material gas, it reacts in like manner, thereby depositing titanium oxide and $4NH(CH_3)_2$.

In performing a maintenance operation for the vacuum exhaust system 34, the system including the pump 42 for precision evacuation and the removing apparatus 40 is first isolated by closing the first and second on-off valves 38 and 44 in the exhaust passage 36. Alternatively, only the removing apparatus 40 may be isolated by situating the mounting position of the second on-off valve 44 on the upstream side of the pump 42, for example.

Then, the water (or alcohol) supply means 60 is actuated to open the flow control valve 72 of the water (or alcohol) supply pipe 74, whereby the bubbled wet nitrogen gas is supplied to the removing apparatus 40, and water or alcohol is introduced into the apparatus 40.

When the water or alcohol is thus fed into the housing 76, the unaffected process gases and the water or alcohol react according to the aforesaid reaction formula, thereby depositing titanium oxide in the form of white powder and diethylamine. The reaction is fully advanced so that the reading of a pressure gage 114, which is located close to the removing apparatus 40, substantially reaches atmospheric pressure.

The method of supplying the water or alcohol is not limited to the bubbling with nitrogen gas, and water vapor or alcohol which is produced by means of ultrasonic waves may be supplied.

When the reaction is advanced fully, the supply of the wet nitrogen gas is stopped, the second on-off valve 44 on the downstream side is opened, and only the pump 46 for rough evacuation is actuated to discharge generated reactive gases.

The reactive gases are removed by means of a removing apparatus (not shown) which is situated on the downstream side of the exhaust system.

Normally, the deposited unaffected process gases cannot be made stable enough for full reaction by one cycle of reaction. Accordingly, the aforesaid operation is repeated again, that is, the wet nitrogen gas is supplied again for reaction, and the generated reactive gases are discharged. This series of operations is executed repeatedly so that the reactive gas concentration is lowered to a predetermined level, e.g., 20 ppm, or below.

In order to detect the reactive gas concentration, the removing apparatus is preferably provided with a gas concentration measuring unit 116 (see FIG. 1), such as a gas sensor or gas chromatograph.

After the reaction and exhaust are repeated so that the reactive gas concentration is lowered to the predetermined level or below, the thumbscrews 110, which fix the trap body 78, are loosened and disengaged from the housing 76, which is kept at atmospheric pressure inside. Then, the trap fins 94 mechanically remove stabilized titanium oxide and products of reaction which adhere to the fin mounting plates 92 and the like.

Thus, even the reactive deposits can be removed safely and easily for maintenance by being stabilized through reaction with water or alcohol before the disengagement of the trap body.

Although the timing for the maintenance operation can be specified empirically by counting the processed wafers, it can be seized more securely with the aid of a view window 118 of quartz glass, which is attached to a side wall of the housing 76, as indicated by broken line in FIG. 3, such that the internal state can be observed from the outside.

According to the method described above, the process of the unaffected process gases with the wet nitrogen gas and the discharge of the reactive gases (harmful gases) are effected in different processes. Alternatively, however, these operations may be carried out in one process. For example, the wet nitrogen gas may be supplied as the evacuating operation is performed.

In the embodiment described above, the TiN film is deposited with use of the TDEAT or TDMAT as the material gas. According to the present invention, however, any process gases may be used as long as the unaffected process gases and products of reaction can be cooled and removed and rendered harmless by water or alcohol. The process gases used for organic metallic compounds may include, for example, DMAH (dimethylaluminiumhydraido), TIBA (triisobutylaluminium), DMEAA (dimethylethylaminoaran), TMEAA (trimethylaminoaran), TMG (trimethylgallium), and trialkylphosphine.

The resulting film is not to the titanium film, and the present invention may be also applied to the deposition of an aluminum film, tungsten film, steel film, etc.

The object to be processed is not limited to the semiconductor wafer, and the method of the present invention may be also applied to film deposition on any other material, such as an LCD substrate.

The removing apparatus and the maintenance method according to the present invention described herein can provide the following advantageous effects.

The unaffected process gases and products of reaction contained in the exhaust gas from the process apparatus can be cooled to be liquefied and removed.

Thus, the exhaust passage cannot be reduced in flow area or closed up, and the pumps for evacuation can be prevented from being damaged.

Since the trap body can be removed from the housing, moreover, the maintenance operation is easy.

The trapping effect and evacuation speed can be optimized by suitably adjusting the tilt angle of the trap fins.

Further, the deposits can be prevented from adhering to the housing by previously heating the heating means for this purpose, so that the maintenance operation is easier.

The tramp materials can be prevented from liquefying and adhering to the exhaust gas by means of the passage heating means attached to that portion of the exhaust passage which is situated on the upstream side of the removing apparatus.

If the trapped materials directly or indirectly produce reactive substances, furthermore, they can be stabilized through reaction with water or alcohol, so that the maintenance operation is safe.

While the presently preferred embodiment of the present invention has been shown and described, it is to be understood that this disclosure is for the purpose of illustration and that various changes and modifications may be made without departing from the scope of the invention as set forth in the appended claims.

What is claimed is:

1. A vacuum exhaust system for sucking and discharging exhaust gas by a vacuum pump from a process apparatus, said vacuum exhaust system comprising a removing apparatus including a housing inserted in a portion of an exhaust passage which is situated on an upstream side of the vacuum pump, and a trap body removably attached in the housing, and having cooling means for cooling tramp material in the exhaust gas brought into contact with the cooling means, thereby liquefying the tramp material, said vacuum exhaust system comprising:

means for isolating said vacuum exhaust system and removing apparatus, after the tramp material in the exhaust gas is cooled and liquefied by the cooling means in the trap body;

introducing means for introducing water or alcohol into the housing of the isolated removing apparatus so that the water or alcohol reacts with the tramp material to produce reacting gases and solidified deposits; and removing means for removing reactive gases and solidified deposits from the housing of the removing apparatus.

2. The vacuum exhaust system according to claim 1, wherein gas concentration measuring means for measuring the concentration of the reactive gases is arranged in the housing.

3. The vacuum exhaust system according to claim 1, further comprising heating means for heating the exhaust gas so as to prevent the tramp material contained in the exhaust gas from adhering to the inner wall of the vacuum exhaust system.

4. A tramp material removing method for a tramp material from a vacuum exhaust system for sucking and discharging an exhaust gas by a vacuum pump from a process apparatus, said vacuum exhaust system comprising a removing apparatus including a housing inserted in a portion of an exhaust passage which is situated on an upstream side of the vacuum pump, and a trap body removably attached in the housing, and having cooling means for cooling the tramp material in the exhaust gas brought into contact with the cooling means, thereby liquefying the tramp material, said removing method comprising the steps of:

isolating said vacuum exhaust system and removing apparatus, after the tramp material in the exhaust gas is cooled and liquefied by the cooling means in the trap body;

introducing water or alcohol into the housing of the isolated removing apparatus so that the water or alcohol reacts with the tramp material to produce reacting gases and solidified deposits; and removing reactive gases and solidified deposits from the housing of the removing apparatus.

5. The removing method according to claim 4, wherein said steps of isolating, introducing water or alcohol, and removing are executed repeatedly at predetermined times.

* * * * *